United States Patent [19]
Hashimoto et al.

[11] Patent Number: 6,078,535
[45] Date of Patent: Jun. 20, 2000

[54] REDUNDANCY ARRANGEMENT FOR NOVEL MEMORY ARCHITECTURE

[75] Inventors: Masashi Hashimoto, Ibaraki, Japan; Anand Seshadri, Plano, Tex.

[73] Assignee: Texas Instruments Incorporated, Dallas, Tex.

[21] Appl. No.: 09/178,269

[22] Filed: Oct. 23, 1998

Related U.S. Application Data

[60] Provisional application No. 60/063,243, Oct. 23, 1997, and provisional application No. 60/065,508, Nov. 12, 1997.

[51] Int. Cl.$^7$ ...................................................... G11C 7/00
[52] U.S. Cl. ...................... 365/200; 365/201; 365/230.06
[58] Field of Search .................................. 365/200, 201, 365/230.03, 230.06

[56] References Cited

U.S. PATENT DOCUMENTS

| | | | |
|---|---|---|---|
| 4,918,662 | 4/1990 | Kondo | 365/201 |
| 5,347,484 | 9/1994 | Kwong et al. | 365/49 |
| 5,579,269 | 11/1996 | Yamamoto | 365/200 |

*Primary Examiner*—David Nelms
*Assistant Examiner*—David Lam
*Attorney, Agent, or Firm*—Robby T. Holland; Carlton H. Hoel; Frederick J. Telecky, Jr.

[57] ABSTRACT

A semiconductor memory device having a redundancy scheme is disclosed. A memory cell array includes a number of standard word lines sets and at least one redundant word line set. Each standard word line within a standard word line set is selected by lower address signals, and couples memory cells to a different combination of bit line than the other standard word lines within the standard word line set. In a standard mode of operation, transfer gates coupled to each bit line are enabled according to the lower address signals. Each redundant word line within a redundant word line set is selected by a defective address, and couples memory cells to a different combination of bit lines than the other redundant word lines within the redundant word line set. In a redundant mode of operation, the transfer gates are enabled according to an activated redundant word line to ensure that the proper combination of bit lines is coupled to sense amplifier circuits. In this manner, any of the redundant word lines within a redundant word line set may be utilized to replace any of the standard word lines, even if the replaced standard word line couples memory cells to a different combination of the bit lines than the replacing redundant word line.

27 Claims, 11 Drawing Sheets

| AX1 | AX0 | S3 | S4 | S5 | S6 |
|-----|-----|----|----|----|----|
| 0 | 0 | 1 | 0 | 0 | 1 |
| 0 | 1 | 1 | 1 | 0 | 0 |
| 1 | 0 | 0 | 1 | 1 | 0 |
| 1 | 1 | 0 | 0 | 1 | 1 |

| NRD | RWL1 | RWL2 | RWL3 | RWL4 | CLK3 | CLK4 | CLK5 | CLK6 |
|---|---|---|---|---|---|---|---|---|
| 1 | 0 | 0 | 0 | 0 | S3 | S4 | S5 | S6 |
| 0 | 1 | 0 | 0 | 0 | 1 | 0 | 0 | 1 |
| 0 | 0 | 1 | 0 | 0 | 1 | 1 | 0 | 0 |
| 0 | 0 | 0 | 1 | 0 | 0 | 1 | 1 | 0 |
| 0 | 0 | 0 | 0 | 1 | 0 | 0 | 1 | 1 |

REDUNDANCY ARRANGEMENT FOR NOVEL MEMORY ARCHITECTURE

This application claims priority under 35 USC § 119(e)(1) of provisional application Nos. 60/063,243 filed Oct. 23, 1997 and 60/065,508 filed Nov. 12, 1997.

TECHNICAL FIELD

The present invention relates generally to semiconductor devices, and more particularly to circuits for using redundant memory cells to replace defective memory cells in a semiconductor memory device.

BACKGROUND OF THE INVENTION

Semiconductor memory devices typically include a large number of memory cells, each of which can store one or more bits of data. The memory cells are arranged in an array, having a number of rows and columns. Memory cells within the same row are commonly coupled to a word line, and memory cells within the same column are commonly coupled to a bit line. The memory cells within an array are accessed according to the various memory device operations. Such operations include read operations (common to nearly all memory devices), write operations (common to volatile memory devices), and program and erase operations (common to many nonvolatile memory devices). To access memory cells, an external memory address is applied, which activates a word line. When activated, row decoder circuits couple the data stored within the memory cells to the bit lines of the array. The memory address also activates column decoder circuits, which connect a given group of bit lines to input/output circuits and/or program/erase circuits.

In the course of fabricating a semiconductor memory device, manufacturing defects can give rise to nonfunctional memory cells within an array. In order to preserve the functionality of devices having defective memory cells, redundant memory cells are often used. Redundant memory cells are extra memory cells that are used to replace defective memory cells. A typical redundancy scheme includes row-wise redundancy, in which one or more extra rows of memory cells are created within the array. In the event an applied memory address corresponds to a row having a defective memory cell, one of the extra rows of memory cells is accessed in lieu of the row containing the defective memory cell. Redundancy schemes utilizing column-wise redundancy are also well known.

Figure 1:
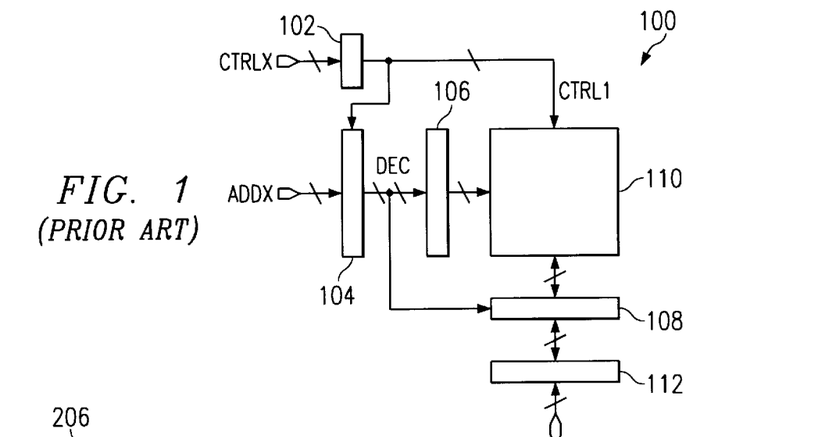
FIG. 1 is a block diagram of a prior art DRAM.

Referring now to FIG. 1, a dynamic random access memory (DRAM) is set forth in a block schematic diagram, and designated by the general reference character 100. The DRAM 100 includes a timing control circuit 102, an address buffer 104, a row decoder 106 and a column decoder 108. The timing control circuit 102 receives externally applied control signals (CTRLX) and generates therefrom internal controls signals (CTRLI) which are applied to the address buffer 104 and to a memory array 110. The address buffer 104 receives externally applied address signals (ADDX) and generates decode signals (DEC). In response to the DEC signals, the row decoder 106 and the column decoder 108 select a memory cell, or group of memory cells within the memory array 110. An input/output (I/O) circuit 112 allows data to be written to, or read from, the column decoder 108.

Figure 2:
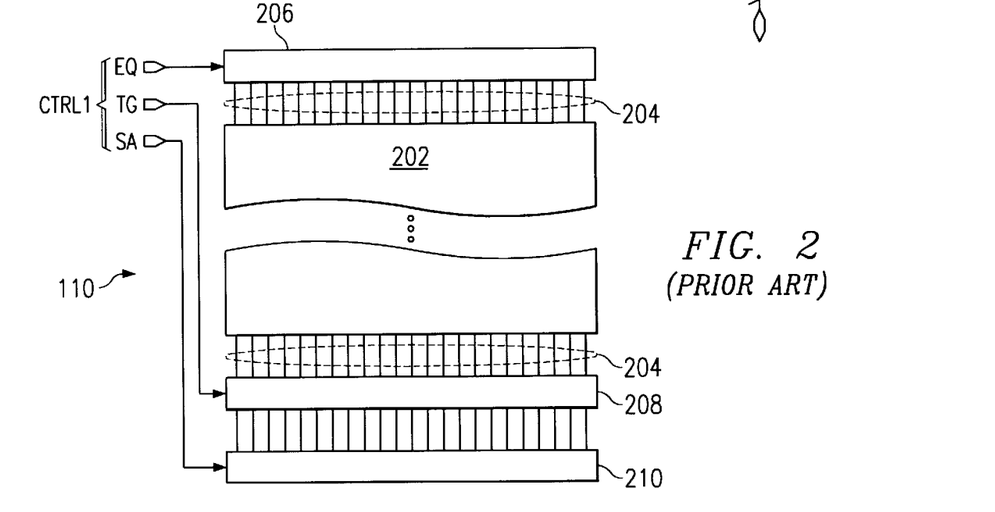
FIG. 2 is a block schematic diagram of the memory array of the DRAM device set forth in FIG. 1.

A portion of the memory array 110 is illustrated in more detail in FIG. 2. The memory array 110 includes a matrix of memory cells 202 coupled to bit lines and word lines. Bit lines 204 are shown extending from the top of the memory cell matrix 202 to a bit line equalization circuit 206, and from the bottom of the memory cell matrix 202 to a transfer gate circuit 208. Word lines are not shown in FIG. 2. The transfer gate circuit 208 is disposed between the bit lines 204 and a bank of sense amplifiers 210. Among the internal control signals (CTRLI) received by the memory array 110, are a bit line equalization signal EQ, a transfer gate enable signal TG, and a sense amplifier enable signal SA. The EQ signal, when high, equalizes bit line pairs by shorting the bit lines together. The TG signal, when high, enables the transfer gate circuit 208, coupling the bit lines 204 to the bank of sense amplifiers 210. The SA signal, when high, enables the bank of sense amplifiers 210, which amplifies data signals on the bit lines 204.

Figure 3:
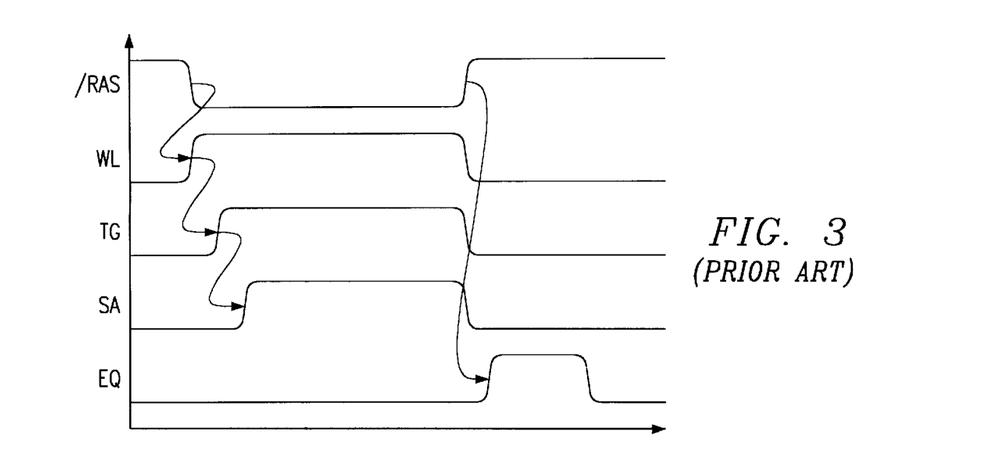
FIG. 3 is timing diagram illustrating the operation of the memory array of FIG. 2.

One type of read operation for the memory array portion 110 is set forth generally, in the timing diagram in FIG. 3. Referring now to FIG. 2 in conjunction with FIG. 3, at the start of a read operation, an externally applied row address strobe signal (/RAS) goes low. The falling edge of the /RAS signal drives a word line (WL) within the memory cell matrix 202 high, coupling a row of memory cells to the bit lines 204 of the memory cell matrix 202. Data signals are present on the bit lines. The TG signal goes high in response to the rising edge of the WL signal, and the bit lines are coupled to the bank of sense amplifiers 210. The SA signal is driven high in response to the rising edge of the TG signal, and the bank of sense amplifiers 210 is enabled, amplifying the voltages on the bit lines. At the end of the read cycle, the EQ signal goes high, equalizing the bit lines 204.

Figure 4:
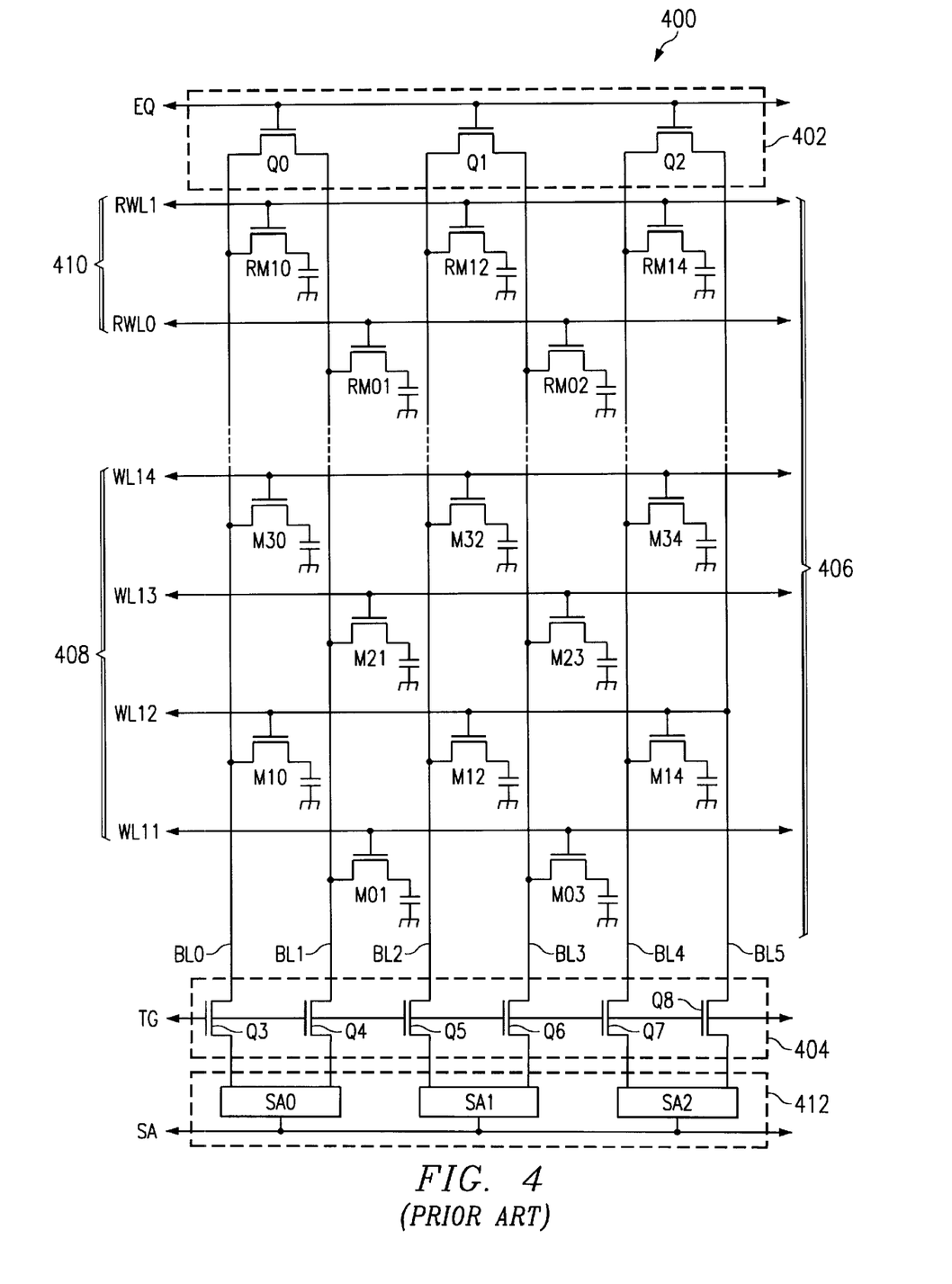
FIG. 4 is a schematic diagram illustrating a prior art redundancy scheme.

Having described the general structure and operation for one type of memory device, one conventional way of implementing a redundancy scheme will now be described. Referring now to FIG. 4, a DRAM array is designated by the general reference character 400, and is shown to include a bit line equalization circuit 402 and a transfer gate circuit 404, disposed at opposite ends of a memory cell matrix 406. The memory cell matrix 406 includes standard memory cells 408 and redundant memory cells 410. The standard memory cells 408 are coupled to bit lines BL0–BL5 and word lines WL0–WL3. The standard memory cells 408 are designated by the reference character Mi,j, where i represents the memory cell word line, and j represents the memory cell bit line. The redundant memory cells 410 are coupled to redundant word lines RWL0 and RWL1, and to the same bit lines as the standard memory cells 408 (BL0–BL5).

The bit line equalization circuit 402 is shown to include a shorting transistor Q0–Q2, each having a source-drain path coupled between pairs of bit lines (BL0/BL1, BL2/3, and BL4/5). The gates of the shorting transistors (Q0–Q2) commonly receive the EQ signal. The transfer gate circuit 404 is shown to include pairs of transfer gate transistors, Q3/Q4, Q5/Q6 and Q7/Q8, each of which couples a pair of bit lines to a sense amplifier (SA0–SA2) within a bank of sense amplifiers 412.

The redundancy scheme illustrated in FIG. 4 illustrates a conventional row-wise redundancy case. A row having a defective memory cell can be replaced by a row of redundant memory cells. For example, in the event a standard memory cell is defective, the entire row containing the defective memory cell can be replaced by a row of redundant memory cells. For example, if the memory cell M10 was defective, memory cells M10, M12 and M14 could be replaced by RM10, RM12 and RM14. The substitution of redundant rows for "bad" standard rows is accomplished by driving redundant word line RWL0 in response to an address that corresponds to word line WL11. The conventional row-wise redundancy described in FIG. 4 is advantageous because defects in other rows, memory cell M21, for example, can be replaced by the second redundant row (i.e., memory cells M21 and M22 replaced by RM01 and RM02). Thus, assuming all the redundant memory cells are functional, in a worst case situation, at least two memory cells can be replaced.

While the conventional memory cell array architecture set forth in FIG. 4 is conducive to the row-wise redundancy scheme described, it is not always desirable to construct semiconductor memory devices with such an array architecture. The need for faster, more compact, devices has given rise to unconventional memory device architectures. Such unconventional architectures are not conducive to conventional prior art redundancy approaches.

SUMMARY OF THE INVENTION

According to the present invention, a semiconductor memory device includes a novel memory cell array architecture having a number of standard memory cells, each coupled to a standard word line and a standard bit line. The word lines of the array can be conceptualized as being grouped into standard word line sets. When a standard word line within a set is activated, the standard word line couples memory cells to predetermined combination of bit lines within a group of bit lines. Each standard word line within a set couples memory cells to a different combination of bit lines from within the group of bit lines.

The semiconductor memory device further includes redundant memory cells, each coupled to a redundant word line and one of the standard bit lines. The redundant word lines include at least one set of redundant word lines, each redundant word line within the set couples redundant memory cells to the different combinations within the same group of bit lines is a standard word line set.

Unlike the conventional memory architecture of FIG. 4, in which all of the bit lines are coupled to sense amplifiers by a single row of transfer gates, in the novel memory architecture of the preferred embodiment, different combinations of bit lines are coupled to different sets of sense amplifiers by a group of select gates. In a standard mode of operation (no redundant word lines utilized), a standard word line is activated, and data is placed on a given combination of bit lines according to the word line address. The same word line address is used to activate the select gates to ensure that the given combination of bit lines having data is coupled to a set of sense amplifiers. In a redundant mode of operation, a redundant word line is activated, placing data on a particular combination of bit lines. The select gates are enabled according to the particular redundant word line that is activated, and not according to word line address, ensuring that the particular combination of bit lines is coupled to a set of sense amplifiers. In this manner, any of the redundant word lines may be substituted for any of the standard word lines, regardless of the position of the redundant word line within its respective set.

According to one aspect of the invention, the standard word lines and redundant word lines are grouped into sets of four word lines.

According to another aspect of the invention, the select gates couple different combinations of bit line pairs to the set of sense amplifiers.

According to another aspect of the present invention, the memory cells are DRAM memory cells.

DETAILED DESCRIPTION OF THE EMBODIMENTS

The preferred embodiment is a redundancy scheme for a novel semiconductor memory device architecture that allows for efficient use of redundant rows of memory cells. The architecture and operation of the novel architecture will first be described. The memory array of the novel memory device architecture is set forth in a schematic diagram in FIGS. 5A–5B. The memory array is designated by the general reference character 500, and is shown to include a memory cell matrix 502, a bit line equalization circuit 504, a column bit line (BL) select circuit 506, a sense amplifier select circuit 508, and a bank of sense amplifiers 510.

Figure 5A:
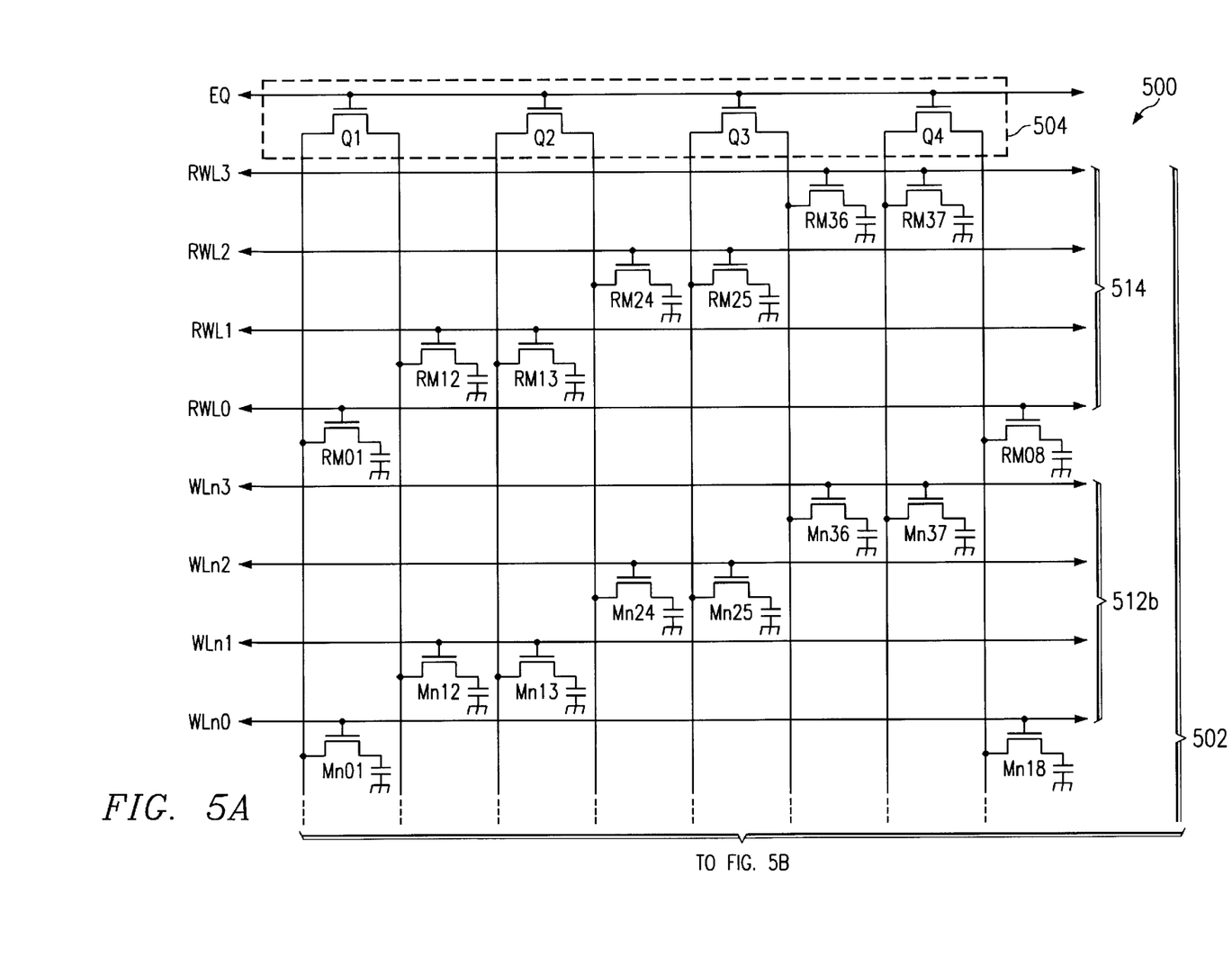
FIGS. 5A–5B is a schematic diagram of a memory array according to a preferred embodiment.
Figure 5B:
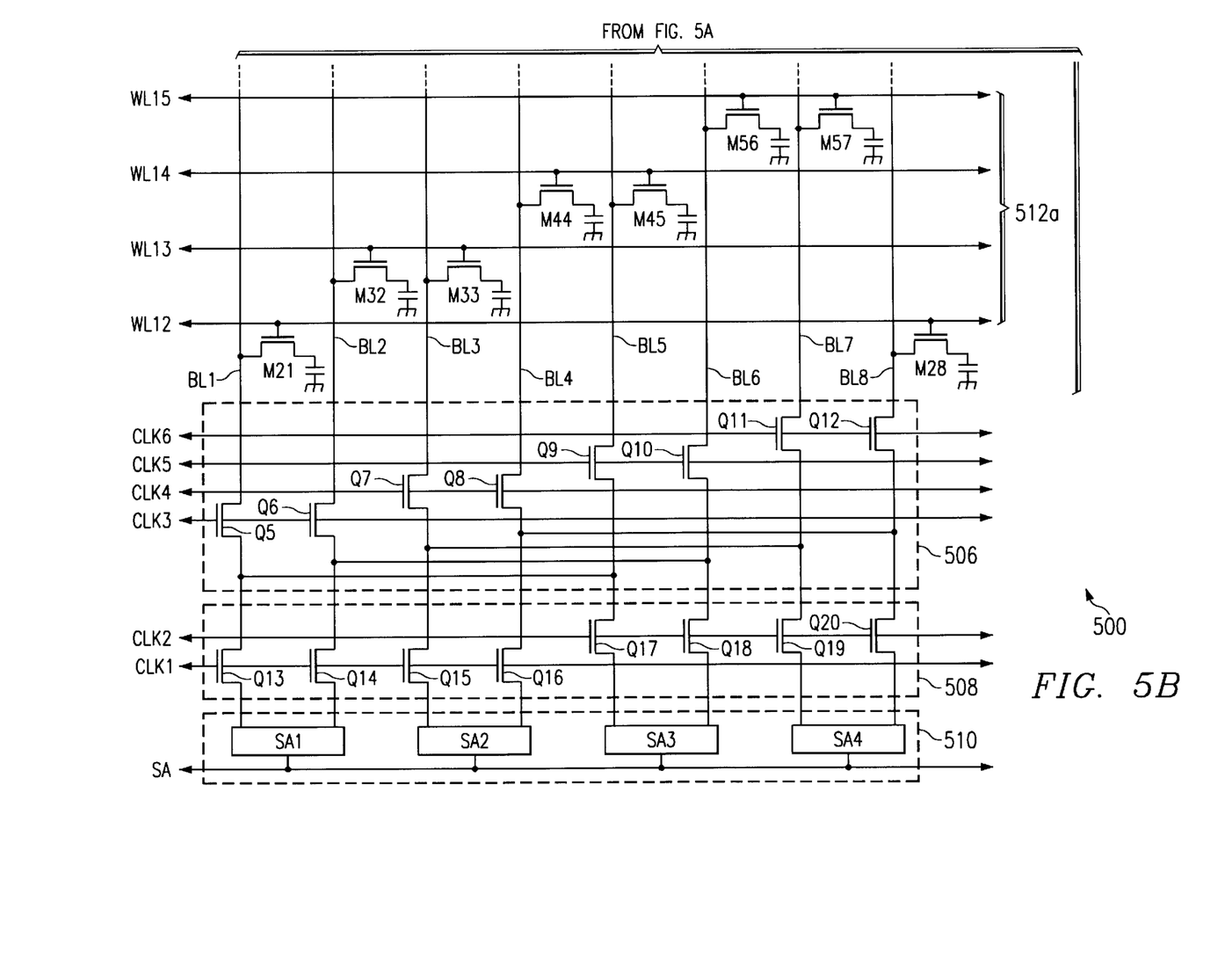

The memory cell matrix 502 includes a number of memory cells coupled to word lines and bit lines in a novel arrangement. The word lines can be conceptualized as being grouped into standard word line sets and redundant word line sets. Two standard word line sets (512a and 512b) and one redundant word line set 514 are illustrated in FIGS. 5A–5B. A first of the standard word line sets 512a includes standard word line WL12 coupled to standard memory cells M21 and M28, standard WL13 coupled to standard memory cells M32 and M33, standard WL14 coupled to standard memory cells M44 and M45, and standard WL15 coupled to standard memory cells M56 and M57. The second standard word line set 512b is similar to the first 512a, having standard word lines WLn0, WLn1, WLn2 and WLn3 coupled to standard memory cells Mn01 and Mn18, Mn12 and Mn13, Mn24 and Mn25, and Mn36 and Mn37, respectively.

The redundant word line set 514 has the same general configuration as the standard word line sets (512a and 512b).

Redundant word line RWL0 is coupled to redundant memory cells RM01 and RM08, redundant word line RWL1 is coupled to redundant memory cells RM12 and RM13, redundant word line RWL2 is coupled to redundant memory cells RM24 and RM25, and redundant word line RWL3 is coupled to redundant memory cells RM36 and RM37.

The novel memory cell matrix 502 of FIGS. 5A–5B also includes eight bit lines (BL1–BL8). Each different standard word line within a standard word line set (and each different redundant word line within a redundant word line set) couples memory cells to a different combination of bit lines. For example, standard word line WL12 couples memory cell M21 to bit line BL1 and memory cell M28 to bit line BL8. The remaining standard word lines of the first standard word line set 512a, each couple two memory cells to two different bit lines. Standard word line WL13 couples memory cells to the bit line combination of BL2 and BL3, standard word line WL14 couples memory cells to the bit line combination of BL4 and BL5, and standard word line WL15 couples memory cells to the bit line combination of BL6 and BL7. This arrangement is repeated in both the second standard word line set 512b and the redundant word line set 514.

Thus, unlike the conventional memory cell array architecture of FIG. 4, in which each word line couples memory cells to every other bit line, the novel architecture of the preferred embodiment has word lines that couple memory cells to combinations of bit lines. As a consequence, the transfer gate circuit 404 of the conventional architecture shown in FIG. 4, is not suitable for use in the preferred embodiment architecture. In the conventional architecture, data is sensed by coupling bit line pairs (BL0/1, BL2/3, BL4/5) to the sense amplifiers (SA0–SA2). The function of the transfer gate circuit 404 therefore, is to couple every bit line to the sense amplifiers, regardless of the word line address. In contrast, because the novel architecture of the preferred embodiment has word lines coupling memory cells to different combinations of bit lines, coupling every bit line to the sense amplifiers will produce an erroneous result.

In order to ensure that the proper combination of bit lines is coupled to the sense amplifiers, the novel memory architecture of the preferred embodiment includes the BL select circuit 506. The BL select circuit includes eight transfer transistors (Q5–Q12), arranged in four transfer gate pairs; Q5/Q6, Q7/Q8, Q9/Q10 and Q11/Q12. Each transfer gate pair is enabled by a separate clock signal. When enabled, the transfer gate pair couples an associated bit line pair to the sense amplifier select circuit 508. Transistor pair Q5/Q6 couples bit line pair BL1/BL2 in response to a CLK3 signal, transistor pair Q7/Q8 couples bit line pair BL3/BL4 in response to a CLK4 signal, transistor pair Q9/Q10 couples bit line pair BL5/BL6 in response to a CLK5 signal, and transistor pair Q11/Q12 couples bit line pair BL7/BL8 in response to a CLK6 signal.

In the novel memory architecture, bit line pairs are coupled in combination of two bit line pairs to one of two sets of sense amplifiers. This capability is accomplished by having the output of transistor pair Q5/Q6 coupled to the output of transistor pair Q9/Q10, and the output of transistor pair Q7/Q8 is coupled to the output of transistor pair Q11/Q12.

Selected combinations of bit lines are coupled to a given set of sense amplifiers by the sense amplifier select circuit 508. In the memory architecture of the preferred embodiment, the sense amplifier select circuit is shown to include two groups of select devices. The first group of select devices includes transistors Q13–Q16, and couples the output of two transfer gate pairs from the BL select circuit 506 to a first group of sense amplifiers (SA1 and SA2). The second group of select devices includes transistors Q17–Q20, and couples the output of two transfer gate pairs in the BL select circuit to a second group of sense amplifiers (SA3 and SA4). Transistors Q13–Q16 have gates that are commonly driven by a CLK1 signal. Similarly, transistors Q17–Q20 have gates that are commonly driven by a CLK2 signal.

The bank of sense amplifiers 510 is divided into a first group of sense amplifiers (SA1 and SA2) and a second group of sense amplifiers (SA3 and SA4). Each sense amplifier is enabled by a sense amplifier enable signal SA. It is understood that different sets of sense amplifiers could be enabled by different SA signals, to reduce power consumption for example. The first group of select devices (Q13–Q16) includes select device pairs Q13/Q14 and Q15/Q16 (which couple bit line combinations to the first set of sense amplifiers (SA1 and SA2). The second group of select devices (Q17–Q20) includes select device pairs Q17/Q18 and Q19/Q20 which couple bit line combinations to the second set of sense amplifiers (SA3 and SA4).

The arrangement of the transfer gate pairs (Q5/Q6, Q7/Q8, Q9/Q10 and Q11/Q12) of the BL select circuit 506, in conjunction with the groups of select devices (Q13–Q16 and Q17–Q20) allows four different combinations of bit line pairs to be coupled to each set of sense amplifiers. For example, if the signals CLK3 and CLK6 are active, the bit line pair combination BL1/BL2 and BL7/BL8 will be coupled to both the first set of select devices Q13–Q16 and the second set of select devices Q17–Q20. Depending upon the values of the CLK1 and CLK2 signal, the bit line pair combination BL1/BL2 and BL7/BL8 will be coupled to either the first set of sense amplifiers (SA1 and SA2) or the second set of sense amplifiers (SA3 and SA4).

The equalization circuit 504 of the preferred embodiment is shown to include shorting transistors Q1–Q4. The source-drain path of each shorting transistor (Q1–Q4) is coupled across adjacent bit lines, with transistor Q1 shorting bit lines BL1 and BL2, transistor Q2 shorting bit lines BL3 and BL4, transistor Q3 shorting bit lines BL5 and BL6, and transistor Q4 shorting bit lines BL7 and BL8. The gates of the shorting transistors (Q1–Q4) are commonly driven by a bit line equalization signal (EQ).

Figure 6A:
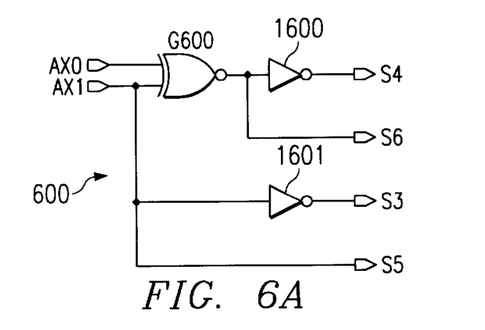
FIG. 6A is a schematic diagram illustrating the column select control logic according to a preferred embodiment.
Figure 6B:
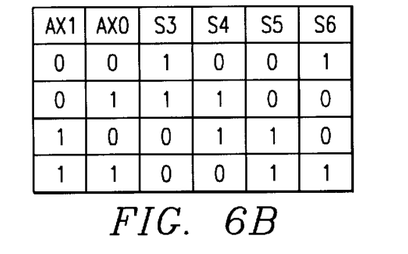
FIG. 6B is a truth table describing the operation of the circuit set forth in FIG. 6A.

In the preferred embodiment, in a standard mode of operation, various pairs of transfer gates are enabled according to an applied address signal. One particular example of a logic circuit used to enable the transfer gates is illustrated by FIGS. 6A and 6B. FIG. 6A is a logic circuit, and FIG. 6B is a truth table illustrating operation of the logic circuit FIG. 6A. Referring now to FIG. 6A, the logic circuit is designated by the reference character 600. The logic circuit 600 receives two lower address signals (AX0 and AX1), and generates therefrom, four select signals (S3–S6). The address signals (AX0 and AX1) are received by a two-input exclusive NOR gate G600. The output of gate G600 provides the S6 signal. The S6 signal is inverted by inverter I600 to generate the signal S4. The address signal AX1 provides the S5 signal. The address signal AX1 is also inverted by inverter I601 to generate the S3 signal. The response of the logic circuit 600 is shown in a truth table in FIG. 6B. As shown in the table of FIG. 6B, each different address signal permutation results in a different combination of active signals (active being a logic "1").

Referring back to FIG. 5, it is noted that the address signals AX0 and AX1 received by the logic circuit 600 are the same address signals used to select one of the standard word lines from its standard word line set (512a and 512b). For example, standard word lines WL12 and WLn0 are selected when AX1=AX0=0, standard word lines WL13 and WLn1 are selected when AX1=0 and AX0=1, standard word lines WL14 and WLn2 are selected when AX1=1 and AX0=0, and standard word lines WL15 and WLn3 are selected when AX1=AX0=1.

In a standard mode of operation (i.e., redundant rows are not driven), the CLK3–CLK6 signals (used to activate transfer gate pairs within the BL select circuit 506) are equivalent to the signals S3–S6 described in FIGS. 6A and 6B. This results in the transfer gate pairs and word lines to being enabled by the same lower address signals, ensuring that the proper combination of bit lines is coupled to the sense amplifiers.

Figure 7A:
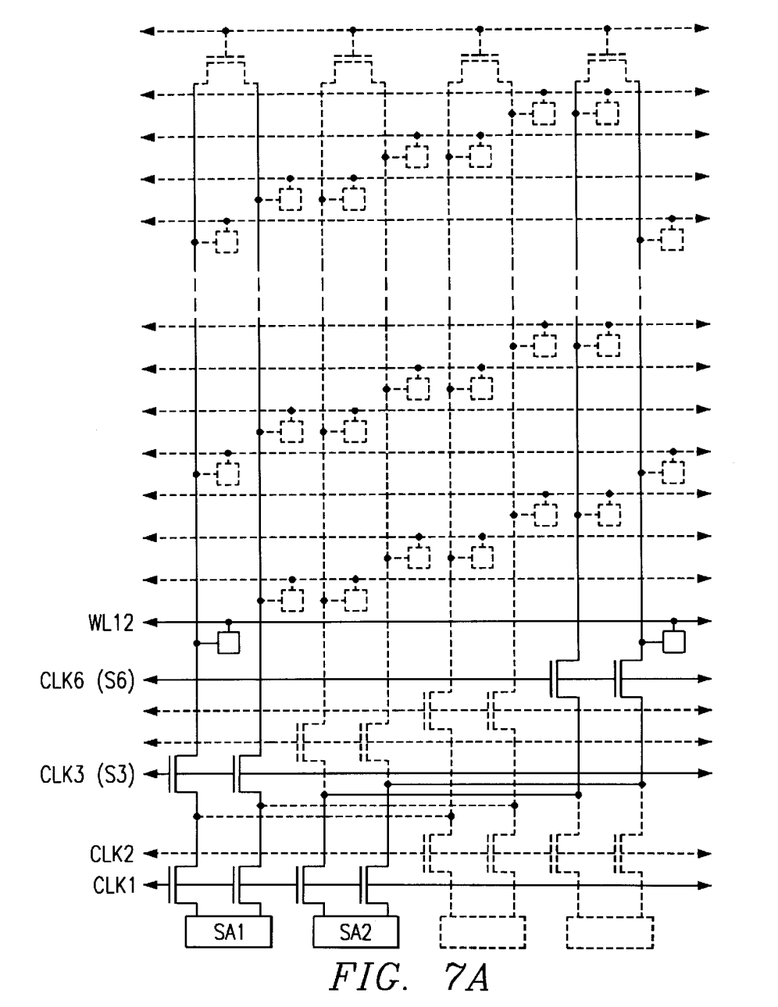
FIGS. 7A and 7B are schematic diagrams illustrating standard modes of operation of the novel memory architecture of the preferred embodiment.
Figure 7B:
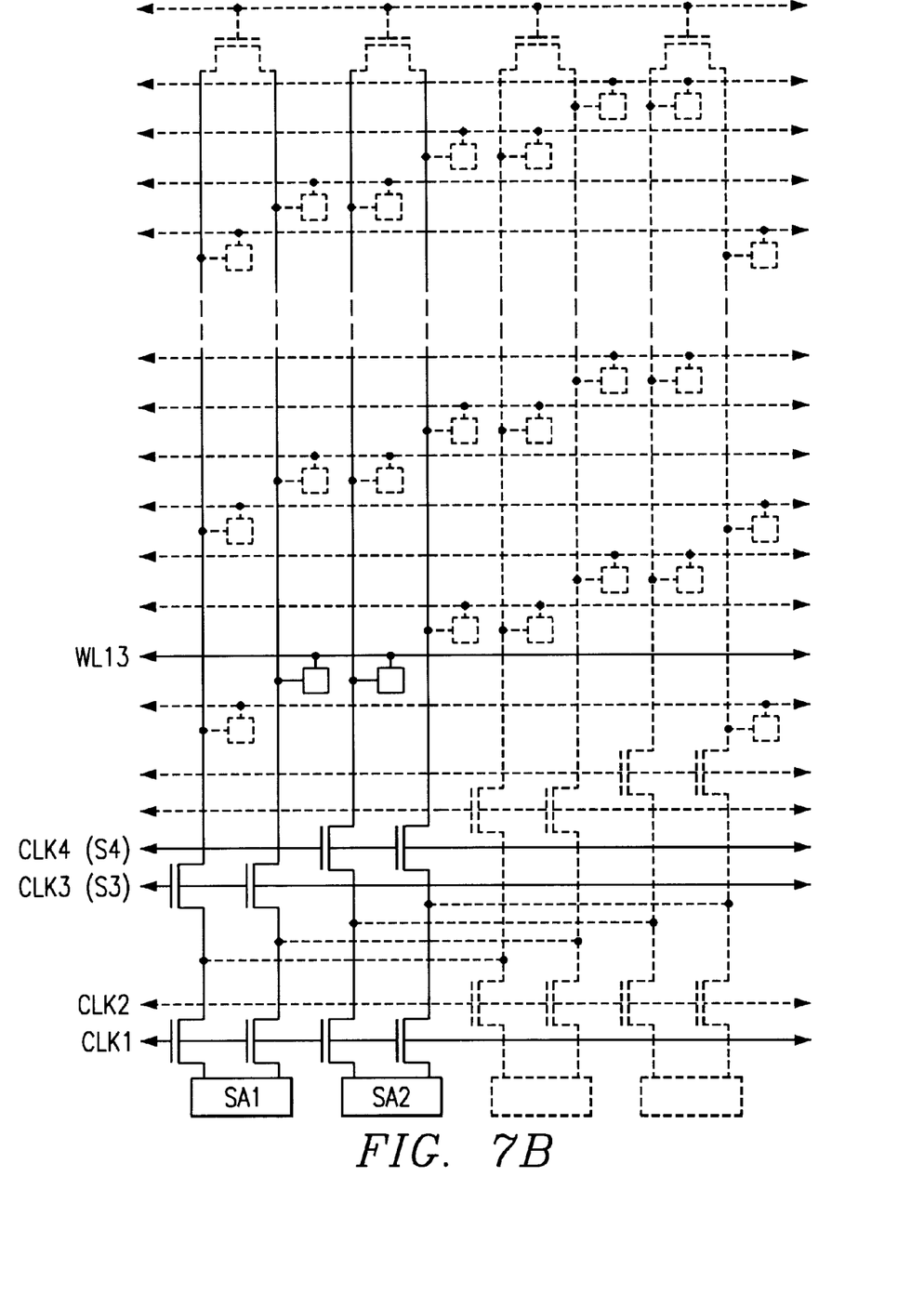

The standard mode of operation of the novel memory architecture is illustrated in FIGS. 7A and 7B. FIGS. 7A and 7B are representations of the schematic diagram set forth in FIG. 5, with the activated portion of the circuit being shown with solid lines, and non-activated portions of the circuit being shown as dashed lines. The memory cells are represented as square shaped boxes, instead of the capacitor/transistor combinations in FIG. 5.

FIG. 7A illustrates a read operation that results in the activation of word line WL12. As will be recalled, the address of word line WL12 includes the two address bits AX1 and AX0 being equal to a logic low "0". As a result, when word line WL12 is activated (driven high), the signals S3 and S6 will both be at a logic high "1" while signals S4 and S5 will be at a logic low. As previously noted, in the standard mode of operation, the signals S3–S6 are equal to CLK3–CLK6. Thus, the CLK3 signal will be high, and transfer gates pair Q5/Q6 will be enabled. The CLK4 and CLK5 signals will be low, turning off transfer gate pairs Q7/Q8 and Q9/Q10. The CLK6 signal will be high, turning on transfer gate pairs Q11/Q12. In this manner, when a word line having an address corresponding to AX1=AX0=0 is activated, the combination of bit line pairs BL1/BL2 and BL7/BL8 is coupled to the sense amplifier select circuit 508. In FIG. 7A, the CLK1 signal is high, and the CLK2 signal is low, and the sense amplifier select circuit 508 couples the active combination of bit line pairs (BL1/BL2 and BL7/BL8) to the first group of sense amplifiers (SA1 and SA2) within the bank of sense amplifiers 510. It is understood that CLK1 could have been low, and CLK2 high, in which case the active combination of bit line pairs would be coupled to sense amplifiers (SA3 and SA4).

FIG. 7B provides a second example of the standard mode of operation for the memory array set forth in FIG. 5. FIG. 7B illustrates a read operation that results in the activation of word line WL13. As will be recalled, in order to activate the word line WL13, the address signals AX1 must be at a logic low, and AX0 must be at a logic high. Referring once again to the table of FIG. 6B, for this address case, the signals S3 and S4 will both be at a logic high, while signals S5 and S6 will be at a logic low. With the CLK3–CLK6 signals being equivalent to the S3–S6 signals, the CLK3 and CLK4 signals will be high, and transfer gates pairs Q5/Q6 and Q7/Q8 will be enabled. The CLK5 and CLK6 signals will be low, turning off transfer gate pairs Q9/Q10 and Q11/Q12. In this manner, when a word line having an address corresponding to AX1=0 and AX0=1 is activated, the combination of bit line pairs BL1/BL2 and BL3/BL4 is coupled to the sense amplifier select circuit 508. As in the case of FIG. 7A, in FIG. 7B, the CLK1 signal is high, and the CLK2 signal is low. The sense amplifier select circuit 508 couples the active bit line pairs (BL1/BL2 and BL3/BL4) to the first group of sense amplifiers (SA1 and SA2) within the bank of sense amplifiers 510.

Figure 8A:
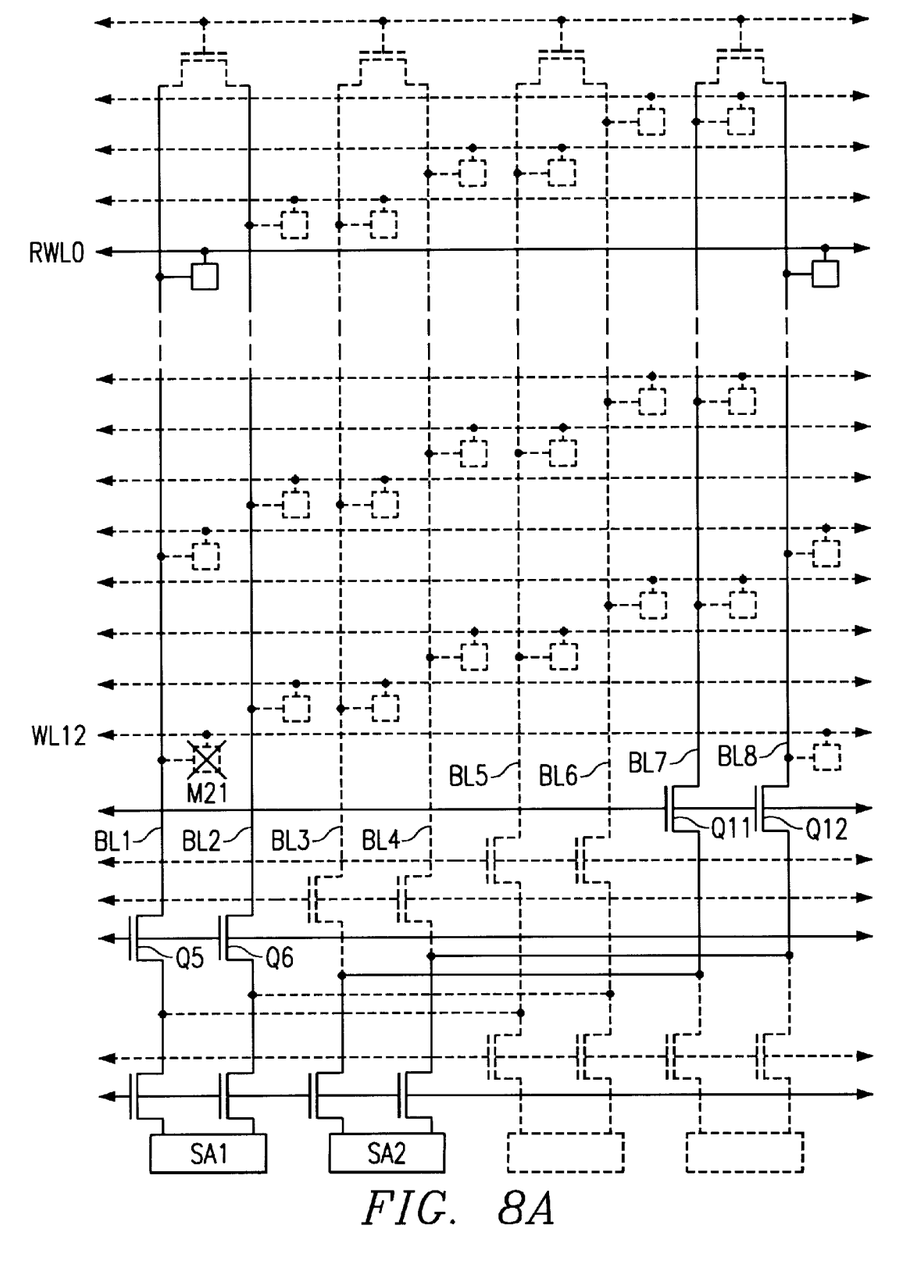
FIG. 8A is a schematic diagram illustrating the implementation of word line redundancy in the novel memory architecture of the preferred embodiment.
Figure 8B:
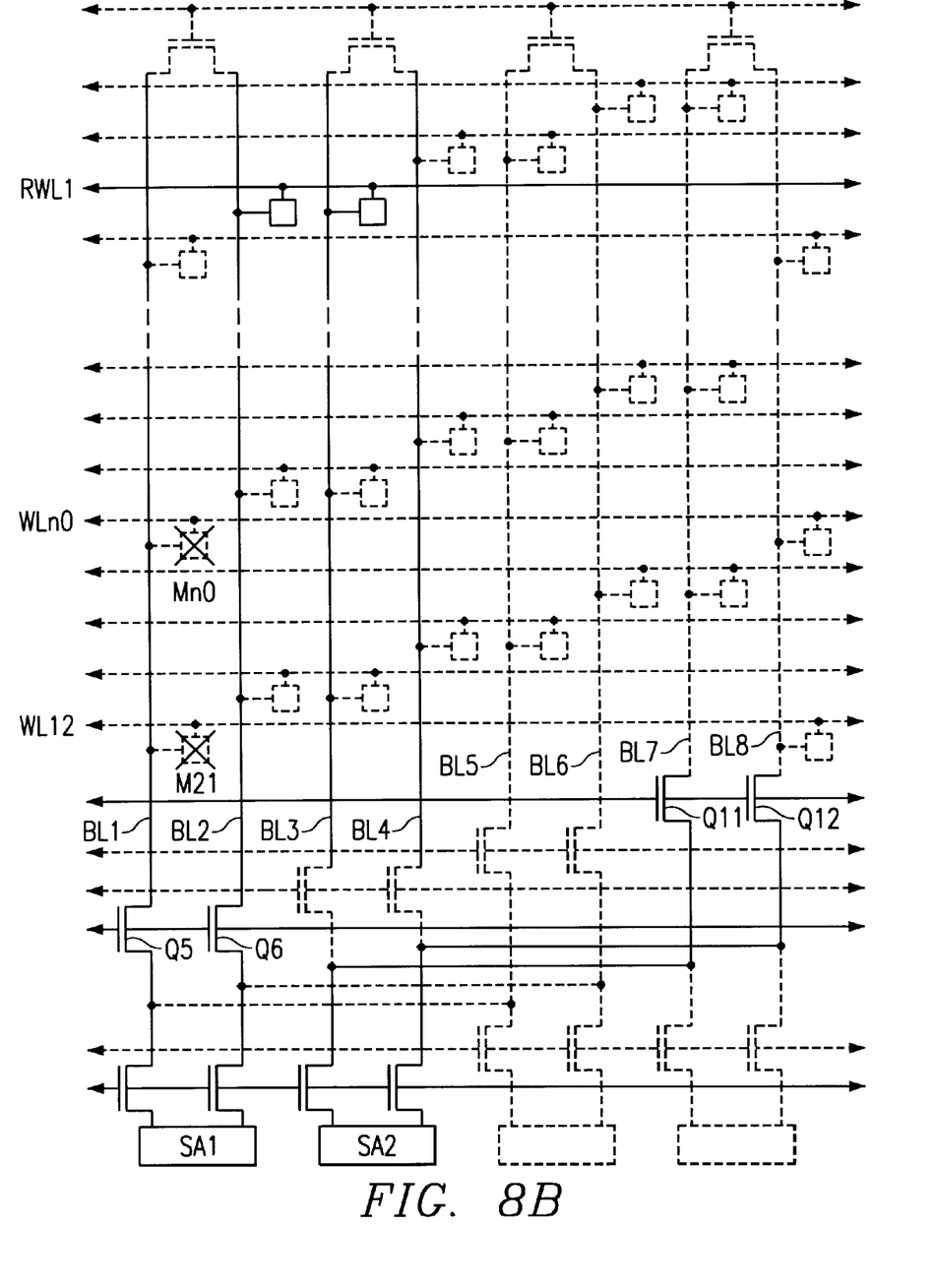
FIG. 8B is a schematic diagram illustrating the incompatibility of a conventional word line redundancy in the novel memory architecture of the preferred embodiment.

The implementation of a conventional redundancy scheme in the novel memory architecture will be discussed in order to understand the advantages of the redundancy scheme according to the preferred embodiment. Referring now to FIGS. 8A and 8B, representations of the schematic diagram set forth in FIG. 5 are set forth, with the activated portion of the circuit being shown with solid lines, and non-activated portions of the circuit being shown as dashed lines. As in the case of FIGS. 7A and 7B, the memory cells are represented by boxes, and not the transistor/capacitor plate of FIG. 5.

Referring now to FIG. 8A, a schematic diagram of the novel memory architecture is set forth. It is assumed that the standard memory cell M21 is defective (the defective memory cell is shown as having an "X" through it). Using a conventional word-wise redundancy scheme, the standard word line containing the defective memory cell (WL12) is replaced by a redundant word line. Due to the unique arrangement of the memory cells within the memory cell matrix 502, of the four redundant word lines within the redundant word line set 514, only redundant word line RWL0 will couple memory cells to the same combination of bit lines (BL1 and BL8) as standard word line WL12. Thus, redundant word line RWL0 must be used to replace standard word line WL12.

A drawback to using the conventional row-wise replacement approach in the novel memory architecture, is that once a redundant word line is used as a replacement for a first standard word line, there are no other redundant word lines within the redundant word line set that are suitable for replacing other standard word lines which couple memory cells to the same combination of bit lines as the first standard word line. For example, referring now to FIG. 8B, it is assumed that standard memory cells M21 and Mn0 are both defective (the defective memory cells are shown as having "X"'s through them). While redundant word line RWL0 may be used to replace standard word line WL12 (and in doing so, replace defective standard memory cell M21) the remaining redundant word lines (RWL1–RWL3) are not suitable for replacing standard word line WLn0 (the word line coupled to the second defective memory cell Mn0). As just one example, FIG. 8B illustrates how redundant word line RWL1 is not suitable to replace standard word line WLn0. When the address corresponding to standard word line WLn0 is applied, the address of word line WLn0 results in transfer gate pairs Q5/Q6 and Q11/Q12 being enabled, coupling bit line pairs BL1/BL2 and BL7/BL8 to sense amplifiers. However, as illustrated in FIG. 8B, redundant word line RWL1 places data on bit line pairs BL1/BL2 and BL3/BL4. Consequently, the data on bit line pair BL3/BL4 is never coupled to sense amplifiers. A review of the logic generated by the circuit illustrated by FIGS. 6A and 6B will show that redundant word lines RWL2 and RWL3 are also unsuitable as replacement word lines for standard word line WLn0.

Figure 9A:
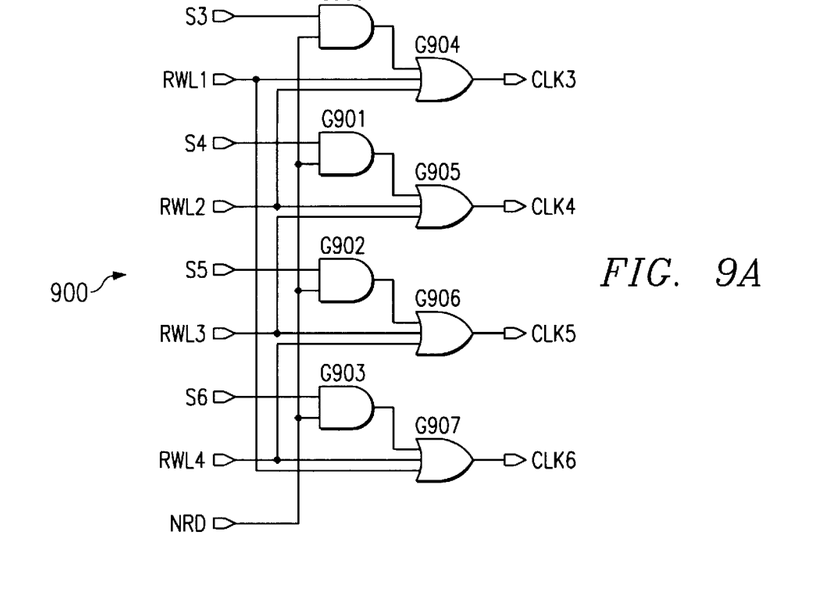
FIG. 9A is a logic diagram illustrating a control circuit according to the preferred embodiment.
Figure 9B:
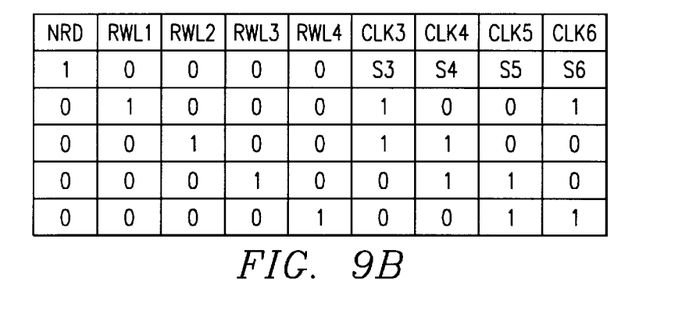
FIG. 9B is a truth table illustrating the operation of the logic circuit set forth in FIG. 9A.

Referring now to FIGS. 9A and 9B, a logic diagram is set forth illustrating a control circuit and corresponding logic table according to the preferred embodiment. The control circuit is utilized to activate the column select circuit 506 for the architecture illustrated in FIG. 5. The control circuit is designated by the general reference character 900, and is shown to include four, two-input AND gates, G900–G903. Each AND gate receives as one input, one of the signals S3–S6. The signals S3–S6 are generated in the same manner is described in FIGS. 6A and 6B (i.e., vary according to address signals AX1 and AX0). The second input to each of the AND gates is a redundant active signal NRD. The NRD signal is low during a standard operation, and high when any of the redundant word lines are activated. Also included within the control circuit 900 are four, three-input OR gates, shown as G904–G907. The outputs of AND gates G900–G903 are provided as one input to OR gates G904–G907, respectively. The remaining inputs to each OR gate (G904–G907) are redundant word line activation signals (RWL0–RWL3).

Each of the redundant word line activation signals (RWL0–RWL3) corresponds to a redundant word line. For example, when the signal RWL1 is high, the redundant word line RWL1 is activated. The redundant word line activation signals are applied to different combinations of OR gates. The signal RWL0 is applied as an input to both OR gates G904 and G907. The signal RWL1 is applied as an input to OR gates G904 and G905. The signal RWL2 is applied as an input to OR gates G905 and G906. The signal RWL3 is applied as an input to OR gates G906 and G907. The output of each OR gate is one of the clock signals CLK3–CLK6, used to activate transfer gate pairs within the column select circuit 506.

The operation of the logic circuit of FIG. 9A is described by the table of FIG. 9B. When the NRD signal is high, the memory is in the standard mode of operation (i.e., redundant word lines are not activated). In this mode, as mentioned previously, CLK3–CLK6 are equivalent to S3–S6. When the NRD signal is low, indicating a redundant word line is being used, the signals CLK3–6 activate the transfer gate pairs appropriate for the activated redundant word line. In this manner, the erroneous case illustrated by FIG. 8B cannot occur. Every time a redundant word line is activated, memory cells are coupled to a unique combination of bit lines. The circuit of FIG. 9A ensures that the transfer gates corresponding to the unique combination of bit lines will be turned on. In this manner, any of the redundant word lines can replace any of the standard word lines, overcoming the limitations present in conventional redundancy approaches.

Figure 10:
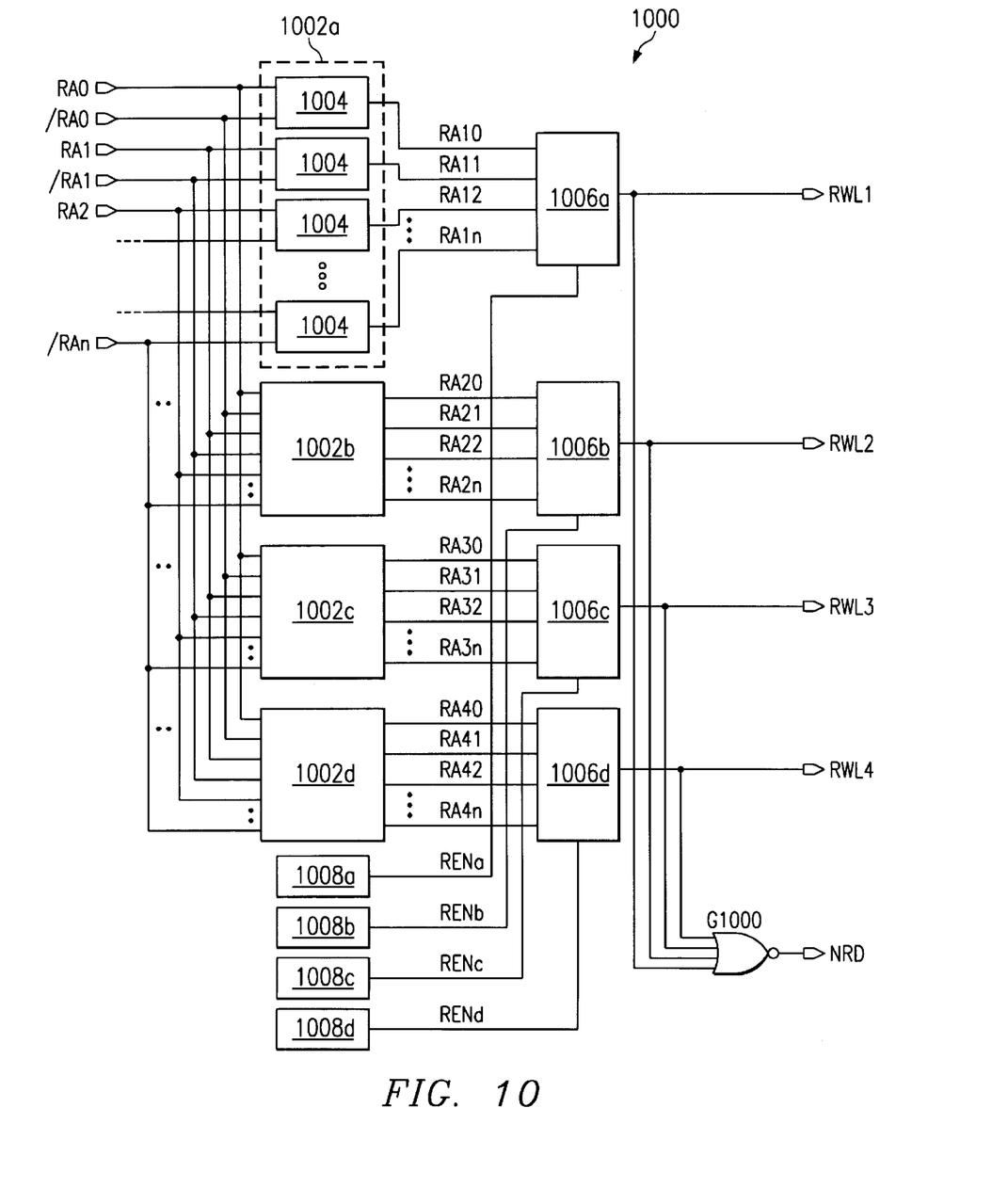
FIG. 10 is a block schematic diagram illustrating a redundant decoding circuit.

Referring now to FIG. 10, a redundant decoding circuit is illustrated in a block schematic diagram, and designated by the general reference character 1000. The redundant decoding circuit 1000 receives a plurality of redundant address signals RA0, /RA0, RA1 . . . /RAn, and generates therefrom the redundant word line signals RWL0–RWL3, as well as the redundant active signal NRD. In the preferred embodiment, the redundant address signals include "true" signals (RA0–RAn) corresponding to an applied external address, and in addition, signals that are complementary to the "true" signals (/RA0–/RAn). The logic of the redundant address signals differ from applied external signals in that both the true and complementary redundant address signals are driven low when an external timing signal /RAS is high.

The redundant address signals (RA0–/RAn) are received by four redundant address input circuits 1002a–1002d. As shown by address input circuit 1002a, each redundant address input circuit (1002a–1002d) includes a redundant signal circuit 1004 corresponding to each of the signals RA0–/RAn. The redundant address signal circuits 1004 can be programmed so that each redundant address input circuit (1002a–1002d) is activated according to a particular "defective" address (the address of a word line that is to be replaced). In the preferred embodiment, when activated, all of the outputs of one of the four redundant address input circuit (1002a–1002d) would be low. For example, to activate redundant word line RWL0, all of the outputs of only address input circuit 1002a must be low. The outputs of the first through fourth redundant address input circuits (1002a–1002d) are shown as RRA10–RRA1n, RRA20–RA2n, RRA30–RRA3n and RRA40–RRA4n, respectively.

Each of the redundant address input circuits (1002a–1002d) has a corresponding redundant word line select (WL SEL) circuit (1006a–1006d). If all of the outputs of an address input circuit (1002a–1002d) are low, the corresponding redundant WL SEL circuit (1006a–1006d) will drive a redundant word line signal RWL0–RWL3 high. In addition, the redundant word line signals (RWL0–RWL3) are provided as inputs into a four-input NOR gate G1000. Each of the redundant WL SEL circuits (1006a–1006d) is enabled by a separate redundant enable circuit (1008a–1008d) which provides a redundant enable signal (RENa–RENd).

Figure 11:
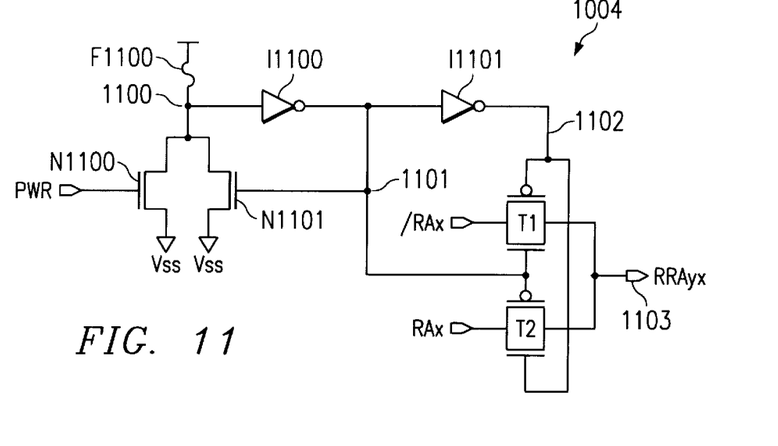
FIG. 11 is a schematic diagram illustrating a redundant address signal generating circuit.

FIG. 11 is a schematic diagram illustrating one example of a redundant address signal circuit 1004 that may be utilized in the redundant decoding circuit 1000. The circuit 1004 includes a fusible link, F1100, coupled between a high power supply Vcc and a first node 1100. Two opposing pull-down transistors N1100 and N1101 are arranged in parallel having common drains coupled to the first node 1100, and sources coupled to the low power supply Vss. The gate of transistor N1100 receives a power-up signal PWR. The signal PWR initially goes high when the circuit is first powered-up, and then falls to a logic low level. The first node 1100 further provides an input to an inverter I1100. The output of inverter I1100 drives the gate of transistor N1101 and a second inverter I1101, and also forms a first passgate enable node 1101. The output of the second inverter I1101 forms a second passgate enable node 1102. The logic states of the first and second passgate enable nodes (1101 and 1102) activate one of two transfer gates T1 or T2. Transfer gate T1 couples an inverted redundant address signal /RAx to an output node 1103 (where "x" is 0–n). Transfer gate T2 couples the non-inverted redundant address signal RAx to the output node 1103. The output node 1103 provides a signal RRAyx, where y varies from 1–4, and corresponds to the redundant address input circuit 1002a–1002d, respectively.

The fuse F1100 within the redundant address signal circuit 1004 is either left intact or opened, depending upon the address of the defective word line. If fuse F1100 is kept intact, the RAx signal is allowed to pass to the output node 1103. If fuse F1100 is kept intact, the /RAx signal is allowed to pass to the output node 1103. Due to this arrangement, if the address bit corresponding to a defective address is a "1", the fuse F1100 is opened, and the output signal RRAyx will be low if RAx is high. On the other hand, if the address bit corresponding to a defective address is "0", the fuse F1100 is kept intact and the RRAyx will be low if RAx is low.

Figures 12, 13:
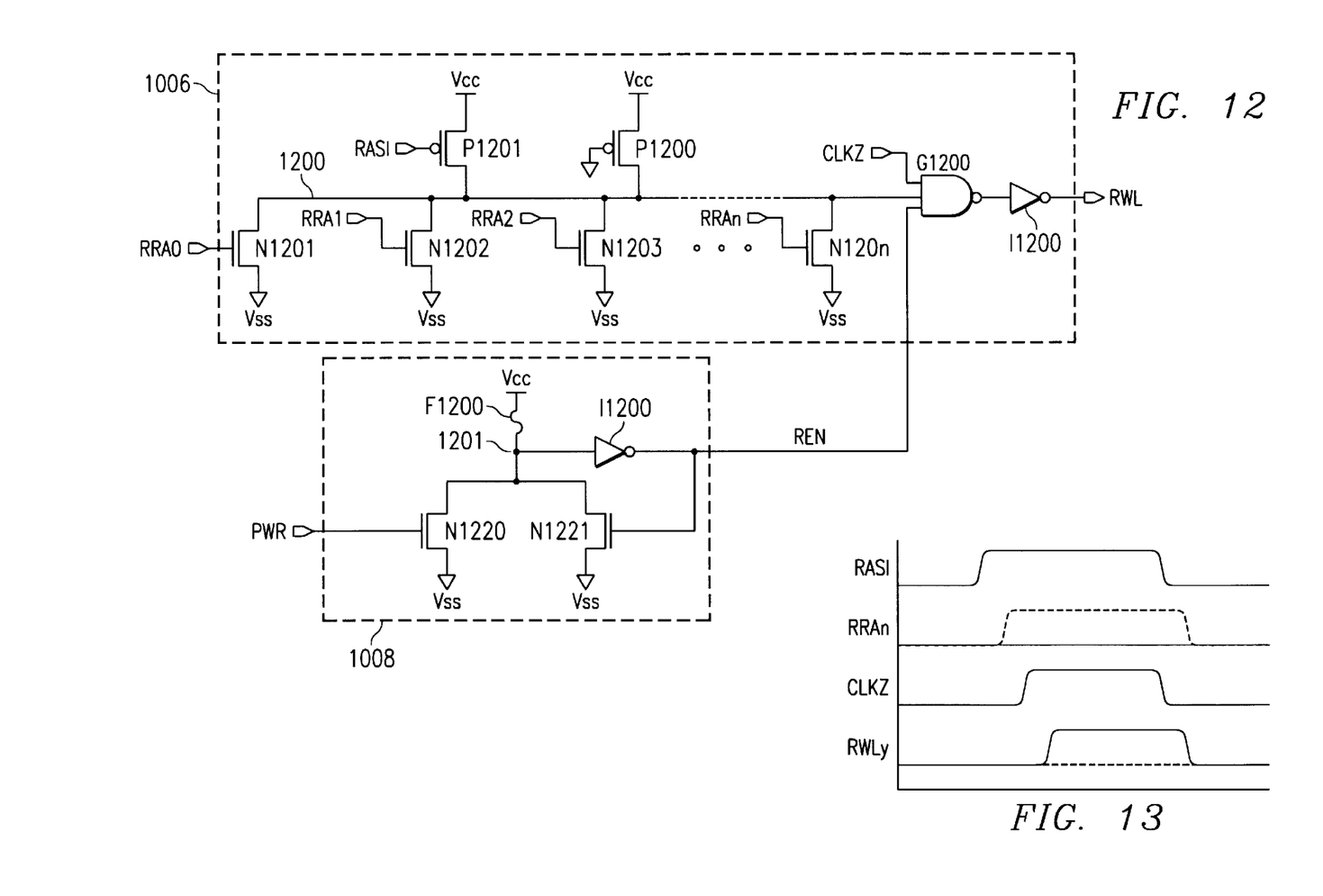
FIG. 12 is a schematic diagram illustrating a redundant word line select circuit.
FIG. 13 is a timing diagram illustrating the operation the redundant word line select circuit of FIG. 12.

Referring now to FIG. 12, a redundant decoder circuit, such as those designated as 1006a–1006d in FIG. 10, and a redundant enable circuit, such as that designated as 1008 in FIG. 10, are set forth in a schematic diagram. The redundant enable circuit is designated by the general reference character 1006, and includes a number of pull-down transistors N1201–N120n, arranged in parallel between a precharge node 1200 and a low power supply Vss. The gate of each pull-down transistor receives one of the output signals from an address signal circuit 1004. A "leaker" transistor, P1200 has a source-drain path coupled between the precharge node 1200 and the high power supply Vcc, and a gate coupled to the low power supply Vss. A pull-up transistor P1201 has a source-drain path coupled between the precharge node 1200 and the high power supply Vcc, and a gate that receives an internal RASI signal. The RASI signal is the inverse of an externally applied /RAS signal.

The precharge node 1200 is provided as one input to a three-input NAND gate G1200. The other inputs to gate G1200 are the REN signal, provided by the redundant enable circuit 1008, and a clock signal CLKZ. The CLKZ signal is provided to ensure the redundant word lines are enabled with appropriate timing in relation to other circuits in the semiconductor memory device. The output of gate G1200 is inverted by I200 to generate the redundant word line signal RWL.

Referring once again to FIG. 12, the redundant enable circuit 1008 is shown to include a fusible link, F1200 coupled between the high power supply Vcc and a first node 1201, two opposing pull-down transistors N1220 and N1221 coupled between the first node 1201 and the low power supply Vss, and an inverter I1201 having an input coupled to the first node 1201. The gate of transistor N1200 receives the power-up signal PWR, previously described in conjunction with FIG. 11. The gate of transistor N1221 is driven by the output of the inverter I1201. The output of inverter I1201 also provides the REN signal. In the event the fuse F1200 is kept intact, node 1201 will be pulled high by the fuse F1200, and the output of inverter I1201 will be driven low. This results is a low REN signal, which forces the output of gate G1200 high, disabling the redundant decoder circuit 1006. When fuse F1200 is opened, on power-up, node 1201 will be pulled low, and the output of inverter I1201 will go high. This will turn on transistor N1221, maintaining node 1201 low. The REN signal will be high, and the redundant decoder circuit 1006 will be enabled.

The operation of the redundant decoder circuit 1200 is best understood with reference to the timing diagram of FIG. 13. Initially, the precharge node 1200 within the redundant decoder circuit 1006 is pulled high by operation of transistor P1201 and a low RASI signal. It will be recalled that the redundant address signals received by each address signal circuit 1004 are initially precharged low when /RAS is high (and RASI is low). As a result, the signals RRA0–RRAn, represented by the RRAn waveform, are all low. The signal CLKZ is low at this time, and the output of gate G1200 is high, resulting in a low RWL signal.

In response to the /RAS signal going low, the RASI signal goes high, initiating a read or write cycle. An address signal is applied and the various signals RRA0–RRAn are driven high and low depending upon an applied address. In the event the applied address signal does not correspond to a defective address, one of the RRAn signals will go high, and the precharge node 1200 will be pulled low. This operation (a "no match" with a defective address) is shown by the dashed portion of the waveform RRAn. In the event the applied address signal corresponds to a defective address, all of the RRAn signals will remain low, and the precharge node 1200 will remain high. This operation (a "match" with a defective address) is shown by the solid portion of the waveform RRAn.

Following the application of the external address, the CLKZ signal will go high. In the event the redundant enable signal REN, is also high, gate G1200 is enabled, and its gate will be driven high or low depending upon the potential of the precharge node 1200. If the precharge node 1200 was low (no match with a redundant address) the output of the gate G1200 will be high, and the word line signal RWL will remain low. This is shown as the dashed portion of the RWL signal. If the precharge node 1200 was high (a match with a redundant address), the output of gate G1200 will go low, and the word line signal RWLy will be driven high.

Although the present invention has been described in detail, it should be understood that various changes, substitutions, and alterations could be made without departing from the spirit and scope of the invention as defined by the appended claims.

What is claimed is:

1. A semiconductor memory device, comprising:
    a plurality of standard memory cells;
    a plurality of bit lines;
    a plurality of standard word line sets, each standard word line set including:
        a first standard word line coupling to standard memory cells to a first combination of bit lines, the first standard word line being activated in response to a first combination of address bits, and
        a second standard word line coupling to standard memory cells to a second combination of bit lines, the second combination of bit lines being different than the first combination of bit lines, the second standard word line being activated in response to a second combination of the address bits;
    a plurality of transfer gates, each transfer gate having an input coupled to at least one of the bit lines and an output coupled to an output node, each transfer gate providing a low impedance path between its input and output when enabled;
    a plurality of redundant memory cells;
    a plurality of redundant word lines, each redundant word line coupling to selected redundant memory cells to different redundant combinations of bit lines; and
    a decoder circuit coupled to the plurality of transfer gates, the decoder circuit having
        a standard mode in which the decoder circuit activates the transfer gates coupled to the first combination of bit lines in response to the first combination of the address bits and activates the transfer gates coupled to the second combination of bit lines in response to the second combination of the address bits, and
        a redundant mode in which the decoder circuit activates the transfer gates coupled to the redundant combination of bit lines of an activated redundant word line.

2. The semiconductor memory device of claim 1, wherein:
    the redundant combination of bit lines is the same as the second combination of bit lines.

3. The semiconductor memory device of claim 1, wherein:
    the plurality of standard memory cells includes dynamic random access memory (DRAM) cells.

4. The semiconductor memory device of claim 1, wherein:
    each of the plurality of bit lines includes a bit line pair.

5. The semiconductor memory device of claim 1, wherein:
    each standard word line set further includes
        a third standard word line coupling standard memory cells to a third combination of bit lines, the third combination of bit lines being different than the first and second combination of bit lines, the third standard word line being activated in response to a third combination of the address bits; and
    the decoder circuit, in the standard mode, activates the transfer gates coupled to the third combination of bit lines in response to the third combination of the address bits.

6. The semiconductor memory device of claim 5, wherein:
  each standard word line set further includes
    a fourth standard word line coupling standard memory cells to a fourth combination of bit lines, the fourth combination of bit lines being different than the first, second, and third combination of bit lines, the fourth standard word line being activated in response to a fourth combination of the address bits; and
  the decoder circuit, in the standard mode, activates the transfer gates coupled to the fourth combination of bit lines in response to the fourth combination of the address bits.

7. The semiconductor memory device of claim 6, wherein:
  the plurality of bit lines includes first through eighth bit lines; and
  each standard word line set includes
    the first standard word line coupling standard memory cells to the first and eighth bit lines,
    the second standard word line coupling standard memory cells to the second and third bit lines,
    the third standard word line coupling standard memory cells to the fourth and fifth bit lines, and
    the fourth standard word line coupling standard memory cells to the sixth and seventh bit lines.

8. The semiconductor memory device of claim 1, wherein:
  the transfer gates include an insulated gate field effect transistor (IGFET), the source-drain path of the IGFET being coupled between the input and output of the transfer gate.

9. The semiconductor memory device of claim 1, wherein:
  the plurality of bit lines includes bit line pairs; and
  each transfer gate has a pair of inputs coupled to a bit line pair and a pair of outputs coupled to a pair of output nodes, the transfer gate including a pair of IGFETs, the source-drain path of the IGFETs being coupled between the pair of inputs and the pair of outputs.

10. The semiconductor memory device of claim 1, wherein:
  the plurality of redundant memory cells includes dynamic random access memory (DRAM) cells.

11. The semiconductor memory device of claim 1, wherein:
  the plurality of redundant memory cells includes at least one redundant word line set, the redundant word line set including:
    first redundant word line coupling redundant memory cells to the first combination of bit lines, and
    a second redundant word line coupling redundant memory cells to the second combination of bit lines; and
  the decoder circuit, in the redundant mode, activates the transfer gates coupled to the first combination of bit lines when the first redundant word line is activated, and activates the transfer gates coupled to the second combination of bit lines when the second redundant word line is activated.

12. The semiconductor memory device of claim 11, wherein:
  the redundant word line set further includes
    a third redundant word line coupling redundant memory cells to the third combination of bit lines; and
  the decoder circuit, in the redundant mode, activates the transfer gates coupled to the third combination of bit lines in response to the third redundant word line being activated.

13. The semiconductor memory device of claim 12, wherein:
  the redundant word line set further includes
    a fourth redundant word line coupling redundant memory cells to the fourth combination of bit lines; and
  the decoder circuit, in the redundant mode, activates the transfer gates coupled to the to the fourth combination of bit lines in response to the fourth redundant word line being activated.

14. The semiconductor memory device of claim 13, wherein:
  the plurality of sense amplifiers is arranged into at least two sense amplifier groups, the number of sense amplifiers within each sense amplifier group being less than the number of transfer gates; and
  the plurality of amplifier passgates includes a group of amplifier passgates corresponding to each group of sense amplifiers, each group of amplifier passgates being commonly enabled, and coupling transfer gate outputs to one of the group of sense amplifiers.

15. The semiconductor memory device of claim 11, wherein:
  each standard word line set further includes
    a third standard word line coupling standard memory cells to a third combination of bit lines, the third combination of bit lines being different than the first and second combination of bit lines, the third standard word line being activated in response to a third combination of the address bits, and
    a fourth standard word line coupling standard memory cells to a fourth combination of bit lines, the fourth combination of bit lines being different than the first, second, and third combination of bit lines, the fourth standard word line being activated in response to a fourth combination of the address bits.

16. The semiconductor memory device of claim 1, further including:
  a plurality of sense amplifiers; and
  a plurality of amplifier passgates disposed between the outputs of the transfer gates and the sense amplifiers.

17. A redundancy circuit for a semiconductor memory device, the redundancy circuit comprising:
  a plurality of bit lines;
  a plurality of transfer gates, each transfer gate coupling a bit line to an output node when enabled;
  a control circuit coupled to the transfer gates, the control circuit receiving a plurality of redundant word line enable signals, and enabling a different combination of transfer gates in response to each of the redundant word line enable signals; and
  wherein each transfer gate is enabled in response to an associated clock signal; and the control circuit includes a plurality of first logic gates, each first logic gate being associated with a transfer gate and generating the enabling clock signal for the transfer gate.

18. The redundancy circuit of claim 17, wherein:
  each redundant word line enable signal being provided as one input to a different combination of first logic gates, each different combination of first logic gates enabling the different combination of transfer gates.

19. The redundancy circuit of claim 18, further including:

a plurality of standard word lines, each standard word line being activated by a combination of standard decoder signals; and the control circuit further includes a plurality of second logic gates, each second logic gate receiving at least one of the standard decoder signal, the output of each second logic gate providing an input to at least one of the first logic gates.

20. A semiconductor memory device having a redundancy capability, the semiconductor memory device comprising:

a plurality of bit lines;

a plurality of standard word lines;

a plurality of redundant word lines, each redundant word line being enabled by a different redundant word line select signal;

a plurality of transfer gates, one transfer gate being coupled to each bit line, each transfer gate having an input and output, and providing a low impedance path between its respective input and output in response to an enable indication at an enable node; and a logic circuit having an output node corresponding to the enable node of each transfer gate, the logic circuit receiving the different redundant word line select signals, and generating a different group of enable indications on the output nodes for each unique redundant word line select signal.

21. The semiconductor memory device of claim 20, wherein:

the plurality of bit lines, the plurality of standard word lines, and the plurality of redundant word lines are coupled to the same array of memory cells.

22. The semiconductor memory device of claim 20, wherein:

the plurality of bit lines are disposed generally perpendicular to the plurality of standard word lines and the plurality of redundant word lines.

23. The semiconductor memory device of claim 20, wherein:

the plurality of bit lines are arranged into at least one group of N bit lines, where N is an integer greater than two; and the plurality of redundant word lines are arranged into at least one set of redundant word lines, each redundant word line within the set coupling memory cells to a different combination of bit lines within the group of N bit lines.

24. The semiconductor memory device of claim 23, wherein:

the plurality of bit lines are arranged into groups of eight bit lines; and the plurality of redundant word lines are arranged into at least one set of four redundant word lines, each redundant word line within the set coupling memory cells to a different combination of two bit lines within the group of eight bit lines.

25. The semiconductor memory device of claim 23, wherein:

the plurality of standard word lines are arranged into a plurality of standard word line sets, each standard word line within the set of standard word lines coupling memory cells to a different combination of bit lines within the group of N bit lines.

26. The semiconductor memory device of claim 23, wherein:

the plurality of transfer gates are arranged into at least one group of N transfer gates; and the logic circuit enables a different combination of transfer gates within the group of N transfer gates for each different redundant word line select signal, the number of transfer gates within each different combination of transfer gates being less than N.

27. The semiconductor memory device of claim 26, wherein:

the plurality of bit lines are arranged into a group of eight bit lines;

the plurality of transfer gates are arranged into a group of eight transfer gates; and the logic circuit enables a different combination of two transfer gates for each different redundant word line select signal.

* * * * *